(12) United States Patent
Naik et al.

(10) Patent No.: US 6,169,030 B1
(45) Date of Patent: Jan. 2, 2001

(54) METALLIZATION PROCESS AND METHOD

(75) Inventors: Mehul B. Naik, San Jose; Ted Guo, Palo Alto; Liang-Yuh Chen, San Jose; Roderick Craig Mosely, Pleasanton; Israel Beinglass, Sunnyvale, all of CA (US)

(73) Assignee: Applied Materials, Inc., Santa Clara, CA (US)

( * ) Notice: Under 35 U.S.C. 154(b), the term of this patent shall be extended for 0 days.

(21) Appl. No.: 09/007,233

(22) Filed: Jan. 14, 1998

(51) Int. Cl.$^7$ ................................................. H01L 21/44
(52) U.S. Cl. ........................ 438/680; 438/654; 438/688
(58) Field of Search ................................. 438/597, 680, 438/681, 688, 654, 676

(56) References Cited

U.S. PATENT DOCUMENTS

| 4,994,162 | 2/1991 | Armstrong et al. | ............ 204/192.15 |
| 5,108,951 | * 4/1992 | Chen et al. . | |
| 5,635,036 | 6/1997 | Demaray et al. . | |
| 5,658,828 | * 8/1997 | Lin et al. | .............................. 438/643 |
| 5,780,357 | * 7/1998 | Xu et al. | .............................. 438/639 |
| 5,877,087 | * 3/1999 | Mosely et al. | ........................ 438/656 |
| 5,981,382 | * 11/1999 | Konecni et al. | ...................... 438/646 |

FOREIGN PATENT DOCUMENTS

| 0451571 | * 10/1991 | (EP) . | |
| 0 451 571 A2 | 10/1991 | (EP) | ........................ H01L 21/3205 |
| 0 451 571 a3 | 10/1991 | (EP) | ........................ H01L 21/3205 |
| 0 499 241 A1 | 8/1992 | (EP) | ........................ H01L 21/3205 |
| 0 529 321 A1 | 3/1993 | (EP) | ............................. H01L 21/90 |
| 0 776 037 A2 | 5/1997 | (EP) | ........................... H01L 21/768 |
| 0 776 037 A3 | 5/1997 | (EP) | ........................... H01L 21/768 |
| 63-278252 | 11/1988 | (JP) | ............................. H01L 21/88 |

OTHER PUBLICATIONS

PCT International Search Report dated Apr. 12, 1999.

* cited by examiner

*Primary Examiner*—Caridad Everhart
(74) *Attorney, Agent, or Firm*—Thomason, Moser & Patterson

(57) ABSTRACT

The invention generally provides an improved process for providing uniform step coverage on a substrate and planarization of metal layers to form continuous, void-free interconnections in high aspect ratio, sub-half micron applications. The invention provides a multi-step PVD process in which the plasma power is varied for each of the steps to obtain favorable fill characteristics as well as good reflectivity, morphology and throughput. The initial plasma powers are relatively low to ensure good, void-free filling of the aperture and, then, the plasma powers are increased to obtain the desired reflectivity and morphology characteristics. The invention provides an aperture filling process comprising physical vapor depositing a metal over the substrate and varying the plasma power during the physical vapor deposition. Preferably, the plasma power is varied from a first discrete low plasma power to a second discrete high plasma power. Even more preferably, the plasma power is varied from a first discrete low plasma power to a second discrete low plasma power to a third discrete high plasma power.

25 Claims, 4 Drawing Sheets

METALLIZATION PROCESS AND METHOD

BACKGROUND OF THE INVENTION

1. Field of the Invention

The present invention relates to a metallization process for manufacturing semiconductor devices. More particularly, the present invention relates to the metallization of apertures to form void-free interconnections between conducting layers, including contacts or vias in high aspect ratio, sub-half micron applications.

2. Background of the Related Art

In semiconductor devices, such as integrated circuits, interconnections are used to connect and integrate the various components of the device. Typically, the devices are composed of many layers of conductive components, separated by an insulating material to help minimize signal paths and reduce the size of the device. To establish continuity between the layers, a conductive interconnection (contact or via) extends between the insulating layers and connects the conductive layers. Thus, an interconnection is a vertical opening filled with conductive material used to connect components on various layers of a device to one another and to the semiconducting substrate.

As the integration of semiconductor devices increases, the sizes of interconnections has been reduced and their aspect ratios (i.e., the ratio of the height of the interconnection to the width) has increased. As a result, methods that in the past were sufficient to fill the interconnections have proved insufficient for the smaller interconnections. Typically, interconnection apertures are filled using a metal material, such as tungsten, aluminum and more recently copper, that is deposited inside the apertures by chemical vapor deposition (CVD), physical vapor deposition (PVD), electroplating, or a combination thereof. A primary problem associated with the filling of small interconnections is that voids tend to form within the interconnections.

A void is an enclosed area devoid of deposited material that is typically formed when two adjoining cusps over step corners of an aperture meet across the space adjoining the vertical feature to form a "bridge." Because sputtered atoms (in PVD) typically follow "line-of-sight" trajectories, a shadowing effect occurs at the aperture and leads to a thinner growth of the metal deposited within the aperture and an accelerated growth rate at the upper step corners of the aperture. The build-up of material at the upper step corners of the aperture creates overhangs or cusps at the corner. If the cusps join before the interior of the aperture is filled, the cusps form a bridge and seal the top of the aperture, thereby creating a void. This effect is generally referred to as "bridging." FIG. 1 is a cross sectional side view of an interconnection illustrating the formation of cusps at the upper step corners of the aperture. FIG. 2 is a cross sectional side view of an interconnection illustrating bridging and the formation of a void in the interconnection.

A void formed in an interconnection may result in a defective circuit and, thus, a defective device. For example, when current passes through the interconnection, the thin internal layers of material adjacent the void in the interconnection may increase the resistance and current density in the thin area which results in a break or open circuit in the interconnection. Consequently, the device fails because of a defective interconnection. Therefore, complete filling of the apertures and the avoidance of voids is critical to ensure reliability of the device.

One method of overcoming void formations uses substrate bias sputtering to re-sputter materials deposited on the side walls of the aperture down to the bottom of the aperture. However, substrate bias sputtering utilizes high re-sputtering rates which reduce the net rate of deposition. Additionally, heavy re-sputtering can cause significant argon incorporation in the films which is known to increase electromigration resistance.

Another attempt to overcome void formations uses CVD to deposit thin conformal layer of aluminum (Al) in high aspect ratio contacts and vias at low temperatures. However, transmission electron microscopy (TEM) data has revealed that continued CVD deposition to complete filling of the interconnection typically still causes bridging and results in the formation of voids.

Another technique for metallization of high aspect ratio apertures is hot planarization PVD which deposits a thin layer of refractory material, such as titanium (Ti), on a patterned wafer to form a wetting layer onto which either (1) a hot PVD Al layer is deposited or (2) a warm PVD Al layer is deposited followed by a hot PVD Al layer. However, hot PVD Al processes are very sensitive to the quality of the wetting layer, wafer condition, and other processing parameters. Small variations in processing conditions or poor coverage of the PVD Ti wetting layer can result in incomplete filling of the apertures, thus creating voids. Thus, even at high temperatures, hot PVD Al processes may still result in bridging and void formation. Furthermore, in order to reliably fill vias and contacts, hot PVD Al processes must be performed at temperatures above about 450° C. which may damage certain components of the device.

Interconnection filling processes that use a CVD process followed by a PVD process have evolved as the most effective manner of interconnection formation for sub-half micron interconnections having an aspect ratio greater than one. Typically, a thin, conformal layer of CVD metal, such as Al, is deposited as a wetting layer to partially fill the aperture, followed by a PVD metal film, such as AlCu, which completely fills the aperture to form the interconnect. This CVD/PVD process has been used successfully for metallization of interconnection structures having sub-half micron apertures with aspect ratios of 5:1.

However, even when using the CVD/PVD process, as the size of the interconnections are reduced, the surface diffusion of the metal into the apertures stops and the hole filling process is then controlled by the solid phase, or bulk diffusion, which is a highly thermally active process. Therefore, achieving interconnection fill using the CVD/PVD process requires a large thermal budget. Accordingly, the PVD metal must be deposited at a low plasma power of less than two kilowatts for a 200 mm substrate, and the low power plasma is typically kept constant throughout the deposition process. However, the low power PVD metal deposition provides unacceptably low reflectivity and a rough, non-planarized morphology of the integrated CVD/PVD stack. Furthermore, using a low power plasma increases the time required to fill the interconnections, and thus, the processing time in the chamber. The increased time in the chamber decreases the throughput of the system.

In addition to overcoming void formation within the interconnection, the metallization process also needs to produce surfaces having high reflectivity. Reflectivity is a measure of the surface roughness, or smoothness, as determined by the amount of light reflected from the surface. Rougher surfaces are less reflective while smooth surfaces are more reflective. Typically, the reflectivity is expressed as a percentage of a known standard surface such as bare silicon which is defined as having a reflectivity of one hundred percent. A reflectivity greater than about 170 percent is desirable to provide successful process integration with subsequent photolithography and metal etch.

FIG. 3 illustrates a cross section of a semiconductor substrate contact deposited using low power plasma PVD. The 0.35 micron contact having an aspect ratio of 3:1 was produced using a low power plasma of about 1 kW (over a 200 mm substrate) in a single-step PVD AlCu process at 400° C. Although the process did not produce any voids, the surface morphology is very rough, and the reflectivity is about 60 percent. Furthermore, the time required to complete the deposition was about 233 seconds. Thus, deposition using low power plasma (less than about five kilowatts for a 200 mm substrate) results in an unsatisfactory film reflectivity of less than about sixty percent and a rough, non-planarized morphology.

High plasma power (greater than about five kilowatts for a 200 mm substrate) PVD deposition can increase the reflectivity and provide a more desirable morphology, but the high plasma power often causes voids to form and a long post-deposition anneal is required to complete the fill. The post-deposition anneal decreases the throughput, thus making the high power plasma PVD option commercially unattractive.

FIG. 4 illustrates a cross section of a substrate contact deposited using high power plasma PVD. The 0.35 micron contact having an aspect ratio of 3:1 was produced using a high power plasma of about 5 kW (over a 200 mm substrate) in a single step PVD AlCu process at 400° C. The result of the high plasma power PVD AlCu process produced voids in the contacts, but a smooth surface morphology and a reflectivity of 180 percent. Thus, although a high power plasma PVD AlCu provides high reflectivity and good morphology, it produces a poor fill that often results in the formation of voids in the produced contact or via.

Consequently, there remains a need for a metallization process for filling apertures that provides for good reflectivity and morphology without creating voids in the filled apertures and without reducing throughput, particularly in high aspect ratio, sub-half micron interconnections.

SUMMARY OF THE INVENTION

The invention generally provides an improved process for providing uniform step coverage on a substrate and planarization of metal layers to form continuous, void-free interconnections in high aspect ratio, sub-half micron applications. The invention provides a multi-step PVD process in which the plasma power is varied for each of the steps to obtain favorable fill characteristics as well as good reflectivity, morphology and throughput. The initial plasma powers are relatively low to ensure good, void-free filling of the aperture and, then, the plasma powers are increased to obtain the desired reflectivity and morphology characteristics.

The invention provides an aperture filling process comprising physical vapor depositing a metal over the substrate and varying the plasma power during the physical vapor deposition. Preferably, the plasma power is varied from a first discrete low plasma power to a second discrete high plasma power. Even more preferably, the plasma power is varied from a first discrete low plasma power to a second discrete low plasma power to a third discrete high plasma power. During the PVD deposition, the plasma power is increased from an initial low power to a relatively high power. Because a low power PVD process produces a good aperture fill and a high power PVD process produces good reflectivity and morphology, the process provides an aperture fill that exhibits good fill, reflectivity, and morphology, even in sub-half micron apertures having a high aspect ratio.

Preferably, the PVD step is preceded by a chemical vapor deposition (CVD) of a metal liner and wetting layer over the surfaces of the aperture. Generally, a CVD Ti layer is deposited over the surfaces of the aperture followed by a layer of CVD TiN in an aluminum deposition process. Then, a CVD Al layer is deposited over the CVD TiN layer followed by the PVD AlCu deposition. For copper, a barrier layer of tantalum and/or tantalum nitride is deposited conformally over the aperture prior to copper deposition.

The PVD metal layer deposition preferably comprises two or more distinct deposition steps using different discrete plasma powers. Alternatively, the invention provides an interconnection metallization process in which the plasma power is varied in a non-discrete fashion or a combination of discrete and non-discrete plasma powers. In a two-step metal deposition process, the initial layer is deposited using a relatively low power that is selected to provide good fill characteristics, and the second metal layer is then deposited on the first metal layer using a relatively high power selected to provide good morphology and reflectivity characteristics.

In a three-step PVD metal deposition process, the first PVD metal layer is deposited using a relatively low power that is selected to provide good fill characteristics. The second PVD metal layer is also deposited using a relatively low power that is selected to provide good fill characteristics. However, the plasma power used for the deposition of the second PVD metal layer is different from, and preferably lower than, the plasma power used in the depositing the first PVD metal layer. A relatively high plasma power is then used to deposit the third PVD metal layer, the high plasma power being selected to provide good morphology and reflectivity characteristics.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention provides a process for metallization of apertures to form void-free interconnections between conducting layers, including contacts or vias in high aspect ratio, sub-half micron applications. In general, the process comprises physical vapor depositing a metal over the surfaces of an aperture using a variable plasma power which is increased from an initial low power (<2 kW) to a relatively high power (>5 kW). Because low power PVD produces good aperture fill and high power PVD produces good reflectivity and morphology, the process provides an aperture metallization without void formation and having excellent reflectivity and morphology, even in a sub-half micron aperture having a high aspect ratio. Preferably, the PVD layer is preceded by a CVD layer of a metal over the surfaces of the aperture to provide a good wetting layer.

Although the present invention focuses on a process in which a metal is chemical vapor deposited and then a metal is physical vapor deposited, it is anticipated and the present invention includes variations of this basic process that, for example, deposits a wetting layer between the dielectric and the soft metal layer to improve the wetting of the soft metal layer. Also, although the description is directed to an aluminum process, other metals such as copper may be advantageously deposited using the process of the invention.

Figure 1:
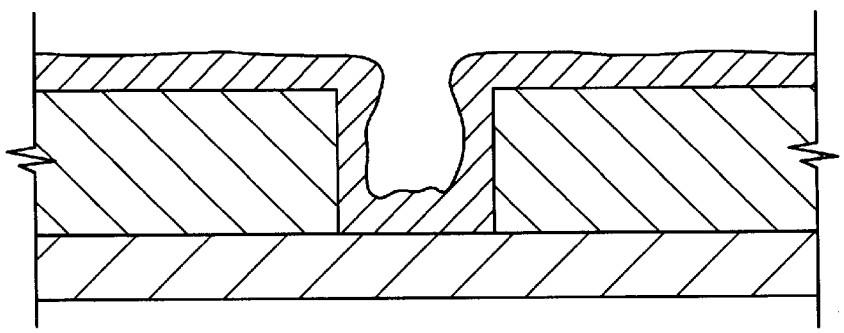
FIG. 1 is a cross sectional side view of an interconnection illustrating the formation of cusps at the upper step corners of the aperture.
Figure 2:
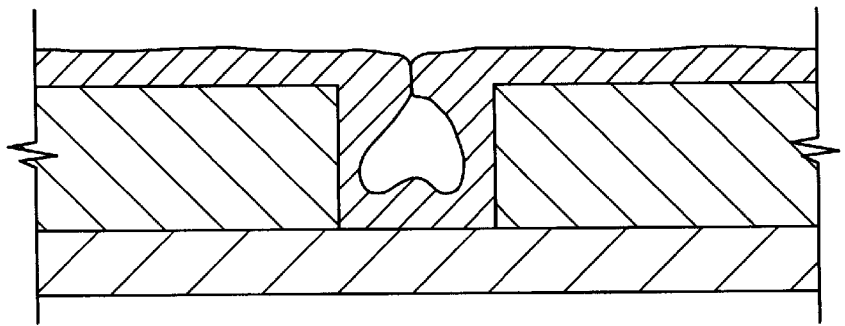
FIG. 2 is a cross sectional side view of an interconnection illustrating bridging and the formation of a void in the interconnection.
Figure 3:
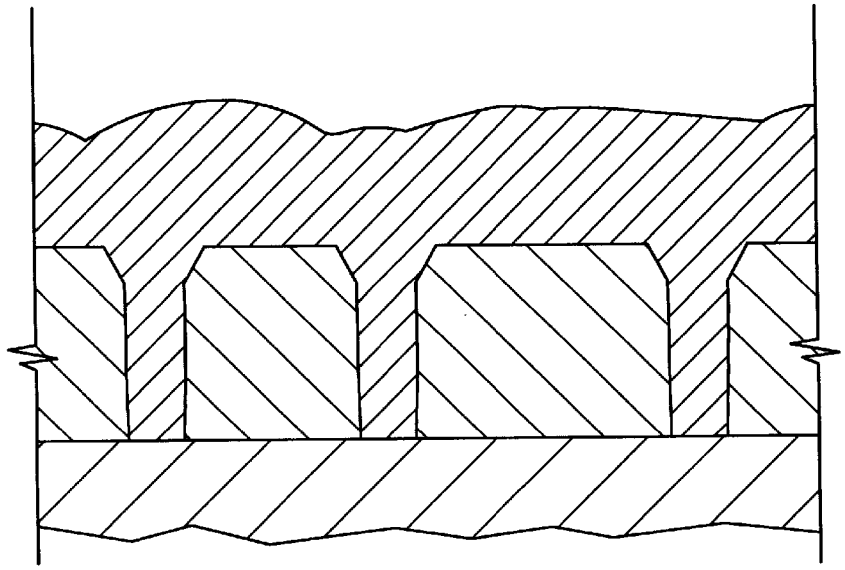
FIG. 3 illustrates a cross section of a semiconductor substrate contact deposited using low power plasma PVD.
Figure 4:
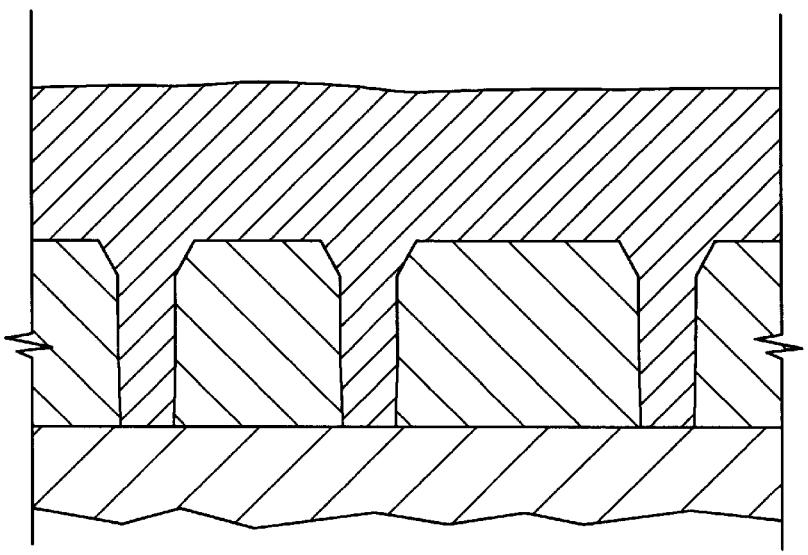
FIG. 4 illustrates a cross section of a substrate contact deposited using high power plasma PVD.
Figure 5:
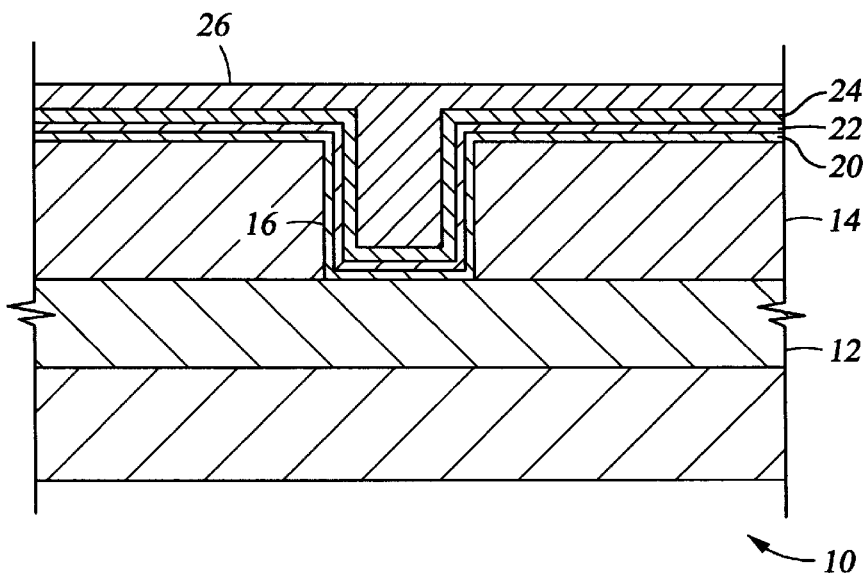
FIG. 5 is a cross sectional side view of an interconnection formed according to the metallization process of the invention.

FIG. 5 is a cross sectional side view of an interconnection formed according to the metallization process of the invention. A semiconductor substrate 10 having a metal layer 12 formed thereon is deposited with a dielectric layer 14 which is etched to form an aperture 16 extending through the dielectric layer 14 and communicating with the metal layer 12. Preferably, a CVD metal layer 24, e.g., aluminum (Al), is deposited over the aperture 16 to form a conformal layer lining the side walls and the bottom of the aperture 16 without sealing the top of the aperture 16. The CVD Al layer 24 provides a conformal wetting layer over the aperture surfaces for receipt of the PVD metal, e.g., AlCu, thereon. While the CVD Al may be deposited under various conditions, a standard process involves wafer temperatures of between about 180° C. and about 265° C. and a deposition rate of between about 20 Å/sec and about 130 Å/sec. The CVD Al deposition may be performed at chamber pressures of between about 1 torr and about 80 torr, with the preferred chamber pressures being about 25 torr. One preferred deposition reaction for CVD Al involves reaction of dimethyl aluminum hydride (DMAH) with hydrogen. Even more preferably, as shown in FIG. 5, a CVD Ti seed layer 20 and a CVD TiN barrier layer 22 are preferably deposited conformally in the aperture 16 before the CVD Al layer.

The substrate 10 is then transferred to a PVD chamber to deposit a AlCu metal layer 26 which completely fills the aperture and provides a planarized top surface. In the preferred embodiment, the plasma power is varied during the PVD AlCu deposition from an initial low plasma power (<2 kW) to a high plasma power (>5 kW). Accordingly, the present invention takes advantage of the positive aspects of the low power plasma PVD AlCu process, namely good fill characteristics, and the high power plasma PVD AlCu process, namely high reflectivity, good morphology, and faster process time resulting in increased throughput. The deposition time periods can be optimized through experimentation for various aperture sizes and aspect ratios.

Figure 6:
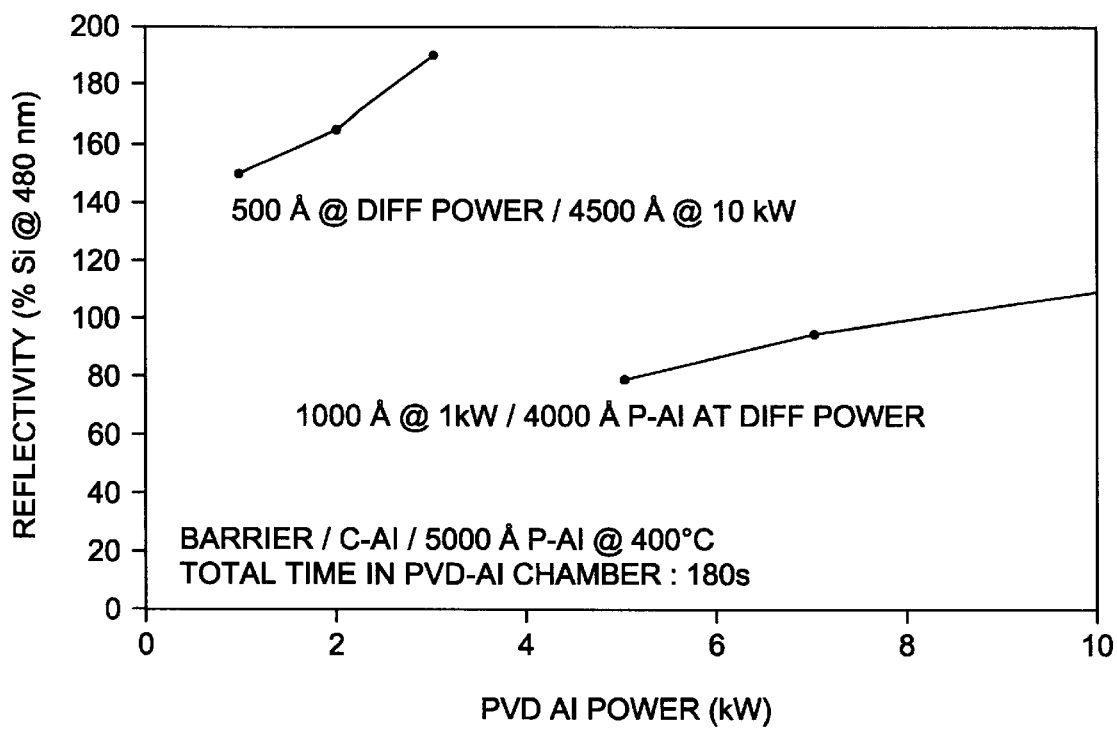
FIG. 6 is a graphical illustration of a reflectivity optimization experiment using a two step PVD AlCu process using different plasma powers for the first and second deposition steps.

FIG. 6 is a graphical illustration of a reflectivity optimization experiment using a two-step PVD AlCu process using different plasma powers for the first and second deposition steps. In this optimization experiment, 200 mm substrates having interconnections with about 0.35 micron apertures and aspect ratios of about 3:1 were deposited using two sequential PVD layers, each layer deposited using a different plasma power level, to determine the effect on the reflectivity of the resulting interconnections.

In one set of the reflectivity optimization experiment, the interconnections were formed by depositing an initial layer of about 1000 Å of PVD AlCu at about 1 kW followed by a second layer of about 4000 Å of PVD AlCu at about 5 kW, 7 kW, and 10 kW plasma power respectively. The resulting interconnections had no void formations therein and exhibited a reflectivity of between about 80 and 110 percent (using bare silicon as standard reflectivity at 480 nm wavelength) which increased as the plasma power of the second step was increased, suggesting that a higher power was more preferable for the second step and that relatively more material need to be deposited using the higher power plasma.

In another set of the reflectivity optimization experiment, the interconnections were formed by depositing an initial layer of about 500 Å of PVD AlCu at about 1 kW, 2 kW, and 3 kW plasma power respectively, each followed by a second layer of about 4500 Å of PVD AlCu at about 10 kW plasma power. With the given layer thicknesses, the reflectivity increased from 150 percent for the 1 kW/10kW combination to about 190 percent for the 3 kW/10 kW combination. Accordingly, a two-step process involving the PVD AlCu deposition of a first layer of about 500 Å at about 3 kW followed by a second layer of about 4500 Å at about 10 kW produced an excellent reflectivity of about 190 percent with complete filling of the aperture and an interconnection free of voids.

Each metallized interconnection produced in the above experiments was completely filled (i.e., the interconnection had no void formation therein). A total of about 5000 Å (thickness) of AlCu was deposited over the substrate surface at about 400° C. in the chamber in about 180 seconds (which is much less than the 233 seconds required by the low power, single step PVD deposition). Reflectivity optimization experiments can be carried out for other combinations of desired deposition thicknesses, aperture widths and aspect ratios to achieve satisfactory reflectivity and throughput time.

Figure 7:
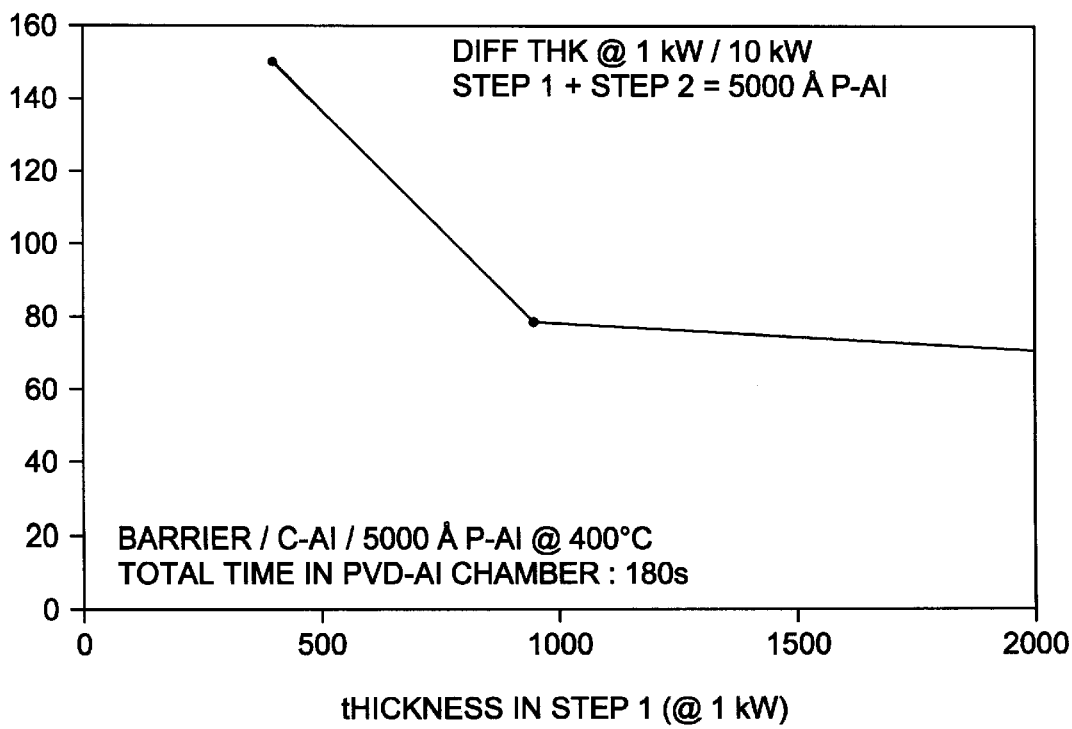
FIG. 7 is a graphical illustration of an experiment used to determine the optimum relative thicknesses of the first step and the second step.

FIG. 7 is a graphical illustration of an experiment used to determine the optimum relative thicknesses of the first step and the second step. In this set of experiments, a total of about 5000 Å (thickness) was deposited using a PVD AlCu process in two steps. The first step used a 1 kW plasma power, and the second step used a 10 kW plasma power. Three deposition thickness combinations were performed, and the relative thicknesses of the first and second PVD steps were about 500 Å/4500 Å, 1000 Å/4000 Å, and 2000 Å/3000 Å. Each of the test runs produced an interconnection free of voids. However, as shown in FIG. 7, a lower thickness for step one (which equates to less time spent in step one at the lower plasma power) produced the best reflectivity.

Accordingly, one preferred embodiment for the invention is to provide a two step PVD AlCu process in which the first step uses a relatively low power and the second step uses a relatively high power. One preferred process uses an initial PVD step that deposits about 500 Å (thickness) of AlCu using a plasma power of about 3 kW and a second PVD AlCu step that deposits about 4500Å (thickness) of AlCu using a plasma power of about 10 kW. The resulting deposition achieves void-free metallization of the apertures and high reflectivity at about 190 percent.

Another embodiment of the invention utilizes a three-step PVD AlCu process. Table 1 shows the results of a set of experiments using a three-step PVD AlCu process:

TABLE 1

| Step 1 (thickness/ plasma power) | Step 2 (thickness/plasma power) | Step 3 (thickness/ plasma power) | Reflectivity |
| --- | --- | --- | --- |
| 500 Å/3 kW | 1000 Å/1 kW | 3500 Å/10 kW | 100% |
| 500 Å/3 kW | 500 Å/1 kW | 4000 Å/10 kW | 190% |
| 300 Å/3 kW | 700 Å/1 Kw | 4000 Å/10 kW | 160% |

Each of the interconnects produced using the above three-step PVD process was free of voids. As shown in Table 1, a three-step process in which the combination of 500 Å of PVD AlCu deposited at 3 kW followed by 500 Å of PVD AlCu deposited at 1 kW followed by 4000 Å of PVD AlCu deposited at 10 kW produced an interconnect having a complete fill (void-free) and a reflectivity of about 190 percent. Therefore, by using a three-step process, a greater amount of the material can be deposited at the lower plasma power levels while obtaining the same resulting reflectivity as the two-step process. Accordingly, the reliability of the process is increased using a three-step process (as compared to a two-step process) because depositing more material using a low power plasma reduces the likelihood of bridging which results in void formation in the aperture.

Thus, the invention provides a multi-step PVD process in which the plasma power is varied for each of the steps to obtain favorable fill characteristics as well as good reflectivity, morphology and throughput. The initial plasma powers are relatively low to ensure good, void-free filling of the aperture and, then, the plasma powers are increased to obtain the desired reflectivity and morphology characteristics. The multi-step PVD process may be divided into a discrete number of steps in which the plasma power remains constant within each of the steps. Alternatively, the plasma power within the PVD step may vary in a non-discrete manner, such as by ramping up the plasma power during deposition from an initial low plasma power to a high plasma power. Furthermore, the PVD process may include a combination of discrete steps and non-discrete variance of the plasma power. For example, in one discrete step of the PVD process, the plasma power may vary between different relatively low plasma powers in a non-discrete manner (such as ramp up or ramp down) and, in a second discrete step of the PVD process, the plasma power may maintain a relatively high plasma powers in a discrete manner. Therefore, at its essence, the present invention is the varying of the plasma power during the PVD process for specific periods of time to achieve void-free metallization of apertures and high reflectivity.

Figure 8:
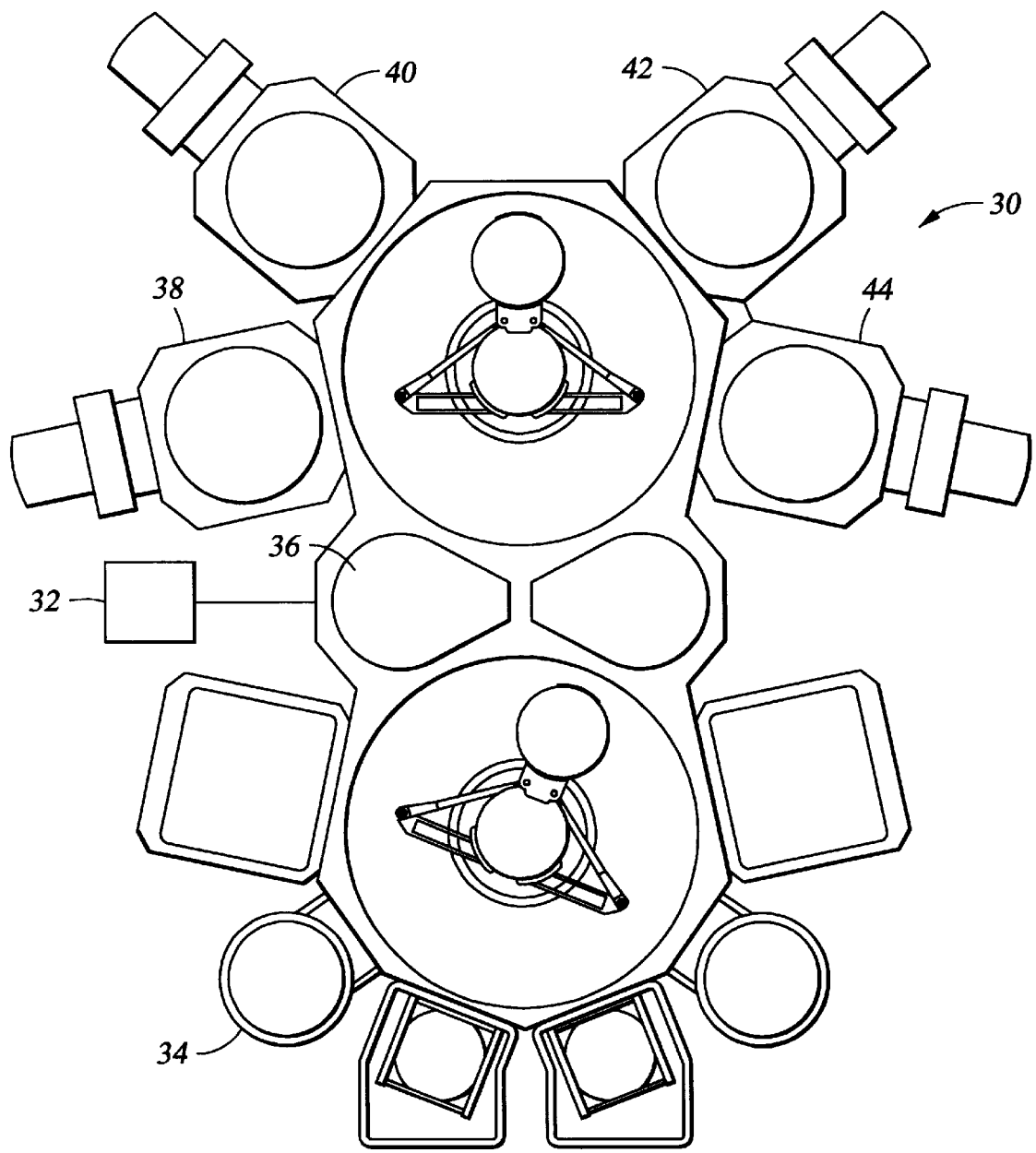
FIG. 8 is a schematic view of an integrated CVD/PVD system configured for sequential metallization in accordance with the invention.

FIG. 8 is a schematic view of an integrated CVD/PVD system configured for sequential metallization in accordance with the invention. Generally, the chambers typically include an enclosure, a substrate support member located within the enclosure, means for providing deposition material to be deposited on the substrates, and power means to provide an electrical bias within the chambers (i.e. the PVD chamber) to excite an inert gas, such as Ar, into a plasma state to sputter the target. The cluster tool also generally includes two robots for transferring the substrate through the processing steps required for the formation of film layers thereon.

A microprocessor 32 is provided to control the sequence and formation of the desired film layers and to control the plasma power of the PVD process. The cluster tool 30 generally includes a de-gas chamber 34 wherein the substrates are introduced to outgas contaminants. The substrate is then transferred to a pre-clean chamber 36 where the surface of the substrate is cleaned. Depending on the particular application, the substrate is moved into either a coherent Ti chamber 38, a CVD TiN chamber 40, or both the coherent Ti chamber 38 and then the CVD TiN chamber 40. In the case where the substrate first receives deposition of a coherent layer of Ti, the substrate is then typically processed in the CVD Ti chamber 38. Following deposition of the coherent Ti layer, the substrate is moved into a CVD TiN chamber 40. Next, the substrate is move into a CVD Al chamber 42 for deposit of a conformal CVD layer thereon. Finally, the substrate is introduced into a PVD AlCu chamber 44 for deposition of the PVD layer(s) at different plasma powers.

Improved Cu dispersion throughout the Al layer is achieved by the present invention because the integrated system allows the substrate to be processed continually in a single processing tool. The invention prevents exposure of the processed substrate to the outside environment which may result in the formation of oxide layers on the first deposited (i.e., the CVD Al) layer. Consequently, formation of an oxide layer onto the CVD Al layer inhibits uniform distribution of the Cu provided in the PVD AlCu process throughout the entire Al layer.

While the foregoing is directed to the preferred embodiment of the present invention, other and further embodiments of the invention may be devised without departing from the basic scope thereof, and the scope thereof is determined by the claims which follow.

We claim:

1. A method of forming an interconnection on a substrate, comprising:

physical vapor depositing a metal over the substrate; and
    varying the plasma power during the physical vapor deposition, while the substrate is maintained at a floating potential.

2. The method of claim 1, further comprising:

chemical vapor depositing a metal wetting layer over the substrate before performing the physical vapor deposition step.

3. The method of claim 1 wherein the step of varying the plasma power comprises increasing the plasma power from an initial low power during the physical vapor deposition.

4. The method of claim 1 wherein the step of varying the plasma power comprises providing a first discrete low plasma power and then a second discrete high plasma power.

5. The method of claim 4 wherein the deposition thickness during the first discrete low plasma power is less than the deposition thickness of the second discrete high plasma power and wherein the first discrete low plasma power is about 9.55 W/cm$^2$ and the second discrete high plasma power is about 31.8 W/cm$^2$.

6. The method of claim 5 wherein the deposition thickness during the first discrete low plasma power is about 500 Å and the deposition thickness of the second discrete high plasma power is about 4500 Å.

7. The method of claim 1 wherein the step of varying the plasma power comprises providing sequentially a first discrete low plasma power, a second discrete low plasma power different from the first discrete low plasma power, and then a third discrete high plasma power.

8. The method of claim 7 wherein the second discrete low plasma power is less than the first discrete low plasma power.

9. The method of claim 7 wherein the combined deposition thickness during the first discrete low plasma power and the second discrete low plasma power is less than the deposition thickness of the third discrete high plasma power.

10. The method of claim 9 wherein the deposition thickness during the first discrete low plasma power is about 500 Å, the deposition thickness during the second discrete low plasma power is about 500 Å, and the deposition thickness during the third discrete high plasma power is about 4000 Å.

11. A method of forming an interconnection on a substrate, comprising:

chemical vapor depositing a liner over the substrate;

chemical vapor depositing a metal wetting layer over the liner;

physical vapor depositing a first metal layer over the metal wetting layer using a first plasma power; and physical vapor depositing a second metal layer over the first metal layer using a second plasma power, while the substrate is maintained at a floating potential during the physical vapor deposition of at least one of the first or second metal layers.

12. The method of claim 11 wherein the second plasma power is higher than the first plasma power.

13. The method of claim 11 further comprising physical vapor depositing a third metal layer over the second metal layer using a third plasma power.

14. A process for providing uniform step coverage on a substrate, comprising:

forming a thin conformal CVD metal layer on a substrate;

forming a PVD metal layer over the CVD metal layer; and varying the plasma power and maintaining the substrate at a floating potential while forming the PVD metal layer.

15. The process of claim 14 wherein the step of forming a PVD metal layer comprises:

forming a first PVD metal layer over the CVD metal layer using a first, low plasma power selected to provide good fill characteristics; and forming a second PVD metal layer over the first PVD metal layer using a second, high plasma power selected to provide good morphology and reflectivity characteristics.

16. The process of claim 14 wherein the step of forming a PVD metal layer comprises:

forming a first PVD metal layer over the CVD metal layer using a first, low plasma power selected to provide good fill characteristics;

forming a second PVD metal layer over the first PVD metal layer using a second, low plasma power selected to provide good fill characteristics; and forming a third PVD metal layer over the second PVD metal layer using a third, high plasma power selected to provide good morphology and reflectivity characteristics.

17. A method of forming an interconnection on a substrate, comprising:

physical vapor depositing a metal onto the substrate; and varying the plasma power during the physical vapor deposition sequentially between a first low plasma power density of about 9.55 W/cm$^2$, a second low plasma power density of about 3.18 W/cm$^2$, and then a third high plasma power density of about 31.8 W/cm$^2$, wherein the combined deposition thickness deposited during the first discrete low plasma power and second low plasma power is less than the deposition thickness of the third high plasma power.

18. A method of forming an interconnection on a substrate, comprising:

depositing a liner over the substrate;

depositing a metal wetting layer over the liner;

physical vapor depositing a first metal layer over the metal wetting layer using a first plasma power;

physical vapor depositing a second metal layer over the first metal layer using a second plasma power; and physical vapor depositing a third metal layer over the second metal layer using a third plasma power wherein the second plasma power is lower than the first plasma power, and the third plasma power is higher than the first plasma power.

19. The method of claim 1, wherein varying the plasma power sequentially through discrete levels the temperature of the substrate will be maintained substantially constant at about 300° C. to 400° C.

20. A method of forming an interconnection on a substrate, comprising:

physical vapor depositing a metal over the substrate; and varying the plasma power during the physical vapor deposition, while maintaining the substrate at a temperature less than about 400° C.

21. The method of claim 20 wherein the step of varying the plasma power comprises providing a first discrete low plasma power and then a second discrete high plasma power.

22. A method of forming an interconnection on a substrate, comprising:

physical vapor depositing a metal over the substrate; and varying the plasma power during the physical vapor deposition wherein the step of varying the plasma power comprises providing a first discrete low plasma power density of about 9.55 W/cm$^2$ and then a second discrete high plasma power density of about 31.8 W/cm$^2$.

23. A method of forming an interconnection on a substrate, comprising:

physical vapor depositing a metal over the substrate and varying the plasma power during the physical vapor deposition while maintaining the substrate at a temperature less than about 400° C. wherein the step of varying the plasma power comprises providing a first discrete low plasma power density of about 9.55 W/cm$^2$ and then a second discrete high plasma power density of about 31.8 W/cm$^2$.

24. The method of claim 23 wherein the deposition thickness during the first discrete low plasma power is less than the deposition thickness of the second discrete high plasma power.

25. The method of claim 24 wherein the deposition thickness during the first discrete low plasma power is about 500 Å and the deposition thickness of the second discrete high plasma power is about 4500 Å.

* * * * *